(12) United States Patent
Kang et al.

(10) Patent No.: US 9,305,951 B2
(45) Date of Patent: Apr. 5, 2016

(54) PIXEL STRUCTURE OF CMOS IMAGE SENSOR AND MANUFACTURING METHOD THEREOF

(71) Applicants: Xiaoxu Kang, Shanghai (CN); Yuhang Zhao, Shanghai (CN)

(72) Inventors: Xiaoxu Kang, Shanghai (CN); Yuhang Zhao, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 0 days.

(21) Appl. No.: 14/439,229

(22) PCT Filed: Dec. 28, 2012

(86) PCT No.: PCT/CN2012/087826
§ 371 (c)(1),
(2) Date: Apr. 29, 2015

(87) PCT Pub. No.: WO2014/101097
PCT Pub. Date: Jul. 3, 2014

(65) Prior Publication Data
US 2015/0295002 A1    Oct. 15, 2015

(30) Foreign Application Priority Data

Dec. 26, 2012  (CN) .......................... 2012 1 0575311

(51) Int. Cl.
*H01L 27/146*        (2006.01)
(52) U.S. Cl.
CPC .... *H01L 27/14623* (2013.01); *H01L 27/14621* (2013.01); *H01L 27/14627* (2013.01); *H01L 27/14629* (2013.01); *H01L 27/14636* (2013.01); *H01L 27/14645* (2013.01); *H01L 27/14685* (2013.01); *H01L 27/14689* (2013.01)

(58) Field of Classification Search
CPC .................. H01L 27/14623; H01L 27/14621; H01L 27/14627; H01L 27/14629; H01L 27/14636
USPC .......................................................... 257/432
See application file for complete search history.

(56) References Cited

U.S. PATENT DOCUMENTS

| | | | | |
|---|---|---|---|---|
| 8,587,081 B2 * | 11/2013 | Chao | ................. | H01L 27/14603 257/432 |
| 8,835,981 B2 * | 9/2014 | Oishi | ..................... | H04N 5/369 257/184 |
| 8,847,297 B2 * | 9/2014 | Kim | .................. | H01L 27/14618 257/294 |
| 2008/0315338 A1 * | 12/2008 | Yeo | ................... | H01L 27/14625 257/431 |

FOREIGN PATENT DOCUMENTS

CN          1917222 A      2/2007

* cited by examiner

*Primary Examiner* — Luan C Thai (57) ABSTRACT

A pixel structure of a CMOS image sensor pixel structure and a manufacturing method thereof. The structure comprises a photosensitive element (37) and a multi-layer structure of a standard CMOS device arranged on the silicon substrate (31). A deep groove (38) having a light-transmitting space therein is formed above the photosensitive element, a side wall of the deep groove is surrounded by a light reflection shielding layer (39) continuously arranged in a longitudinal direction to reflect the light incident on the light reflection shielding layer. The side wall of the deep groove is surrounded by metal interconnects, vias, contact holes and polysilicon in annular configurations, thus the incident light on the deep grove is substantially completely reflected, which avoids the optical crosstalk and effectively improves the optical resolution and sensitivity of the pixel and the performance and reliability of the chip.

11 Claims, 6 Drawing Sheets

PIXEL STRUCTURE OF CMOS IMAGE SENSOR AND MANUFACTURING METHOD THEREOF

CROSS-REFERENCE TO RELATED APPLICATION

This application claims the priority benefit of International Patent Application Serial No.PCT/CN2012/087,826, filed Dec. 28, 2012, which is related to and claims the priority benefit of China patent application serial No. 201210575311.1 filed Dec. 26, 2012. The entirety of each of the above-mentioned patent applications is hereby incorporated by reference herein and made a part of this specification.

FIELD OF THE INVENTION

The present invention generally relates to the field of CMOS image sensor technology, more particularly, to a CMOS image sensor pixel structure and manufacturing method thereof which can improve the optical performance.

BACKGROUND OF THE INVENTION

CMOS image sensor is rapidly developed owing to its compatibility with the CMOS process. Compared with the manufacturing process of a CCD image sensor, the manufacturing process of a CMOS image sensor is performed by forming photosensitive elements and CMOS processing circuits together on a silicon substrate, which is completely compatible with the CMOS process, thereby greatly reducing the cost while keeping the device performance, substantially improving the integration, and enabling the production of image sensors having more pixels.

The conventional CMOS image sensor is manufactured using front side illumination (FSI) method by which the photosensitive elements and the CMOS processing circuits are formed together in a same layer on a silicon substrate, wherein the interconnects are only formed on the CMOS processing circuits without covering the photosensitive elements so as to make the light pass through. However, since the light transmission of the conventional semiconductor material is rather low, it is required to remove all of the dielectric layers formed on the photosensitive elements and then fill light-transmitting material to increase the light absorption.

However, with the shrinking of pixel size, the space between the adjacent pixels also sharply decreases; therefore, when the light is incident to a pixel, the incident light will pass through the space between the adjacent pixels into a nearby pixel after several refractions and reflections, which will produce optical crosstalk between the pixels and cause worse pixel imaging sensitivity, resolution and clarity, thus making the performance of the chip become worse. Therefore, how to reduce the optical crosstalk between the adjacent pixels and increase the incidence of light, so as to improve the pixel resolution and sensitivity is a technical problem need to be resolved by those skilled in the art.

SUMMARY OF THE INVENTION

Accordingly, an objective of the present invention is to provide a pixel structure of a CMOS image sensor and a manufacturing method thereof.

The pixel structure of the CMOS image sensor provided by the present invention comprises a photosensitive element and a multi-layer structure of a standard CMOS device on a silicon substrate. A deep groove having a light-transmitting space therein is formed above the photosensitive element, wherein the side wall of the deep groove is surrounded by a light reflection shielding layer continuously arranged in a longitudinal direction to reflect the light incident on the light reflection shielding layer.

Preferably, the horizontal projection area of the deep groove completely covers the photosensitive element to enable all the light incident into the deep groove to be absorbed by the photosensitive element.

Wherein, the multi-layer structure includes a first polycrystalline silicon layer, a first metal interconnect layer, a first contact hole layer, a first via layer and a first interconnecting dielectric layer.

In a first embodiment, the light reflection shielding layer is a metal reflection layer.

Preferably, the metal reflection layer is arranged inward and attached to the side wall of the deep groove. Herein 'inward' represents a direction from the outside to the inside of the deep groove.

Preferably, the metal reflection layer extends from the bottom of the deep groove up to the top of the deep groove, and further extends to cover the multi-layer structure. Preferably, the top layer of the multi-layer structure is a dielectric layer which isolates the metal reflection layer from the metal interconnect layer of the multi-layer structure. The metal reflection layer on the top of the multi-layer structure reflects the light incident from the top into the inner of the multi-layer structure, so as to further avoid the optical crosstalk to the adjacent pixel structures caused by the incident light.

Preferably, the material of the metal reflection layer includes conventional metal materials such as Al, Cu, Pt, Ru, TaN, Ta, Ti, TiN, and composite stacked materials thereof, such as the composite metal Ti/TiN/Al; the metal reflection layer has a thickness of 50 Å-5000 Å, and is formed by a film-forming method such as PVD (Physical Vapor Deposition), CVD (Chemical Vapor Deposition), or ALD (Atomic Layer Deposition).

In a second embodiment, the light reflection shielding layer is a metal reflection layer which is arranged outward surrounding the side wall of the deep groove with a dielectric layer formed between the metal reflection layer and the deep groove. Herein 'outward' represents a direction from the inside to the outside of the deep groove.

In a third embodiment, the light reflection shielding layer includes a second polycrystalline silicon layer formed by polysilicon in a circle, a second contact hole layer formed by multiple contact holes closely arranged in a circle, a second metal interconnect layer formed by metal connects arranged in a circle and a second via layer formed by multiple vias closely arranged in a circle which are stacked continuously from bottom to top; the light reflection shielding layer is arranged outward surrounding the side wall of the deep groove with a dielectric layer formed between the light reflection shielding layer and the deep groove.

Wherein, the multiple layers of the light reflection shielding layer mentioned above correspond to the multi-layer structure of the standard CMOS device and are formed by the standard CMOS process.

Wherein, the light reflection shielding layer includes several second metal interconnect layers and several second via layers which are stacked in a staggered relationship with respect to each other.

Wherein the space between the contact holes in the second contact hole layer and the space between the vias in the second via layer are defined by the minimum space which meets the requirement of the standard CMOS process.

Preferably, the horizontal projection of the light reflection shielding layer has a polygonal shape and surrounds the photosensitive element.

Preferably, the polygonal shape is square or hexagon.

Preferably, the deep groove is filled with a transparent material to form a light-transmitting body.

Preferably, the light-transmitting body formed by the transparent material further covers the metal reflection layer on the top of the multi-layer structure; a color filter layer and a microlens layer are sequentially arranged on the upper surface of the light-transmitting body.

Preferably, the thickness of the dielectric layer between the light reflection shielding layer and the side wall of the deep groove is 0.05 µm-1 µm.

Preferably, the material of the second polycrystalline silicon layer is N-type doped polysilicon, P-type doped polysilicon, or un-doped polysilicon; the second polycrystalline silicon layer can be formed together with an N-type MOS (Metal-Oxide-Semiconductor) gate or a P-type MOS gate or a high resistance polysilicon structure by a gate process of the standard CMOS process.

Preferably, the second contact hole layer is formed by a contact hole process of the standard CMOS process and the material filled in the contact holes of the second contact layer is copper or tungsten.

Preferably, the second metal interconnect layer is formed by a contact hole process of the standard CMOS process and the material of the metal interconnects is copper or aluminum; wherein the second metal interconnect layer can be formed by an Al BEOL process of the standard CMOS process, or by a Cu Damascene process.

Preferably, the second via layer is formed by a contact hole process of the standard CMOS process and the material filled in the vias of the second via layer is copper or tungsten.

Preferably, the transparent material is a transparent resin including C, H and O.

Preferably, the photosensitive element is a photosensitive diode.

A method of fabricating the pixel structure of the CMOS image sensor according to the first embodiment of the present invention includes the following steps:

Step S101: forming the photosensitive element and the multi-layer structure of the standard CMOS device on the silicon substrate;

Step S102: removing dielectric layers on the photosensitive element by lithography and etching to form the deep groove having the light-transmitting space therein;

Step S103: depositing the metal reflection layer on the silicon substrate surface by a film-forming process;

Step S104: removing the portion of the deposited metal reflection layer not attached to the side wall of the deep groove.

Preferably, the method further includes: Step S105: filling the deep groove with a transparent material and performing a planarization process; and Step S106: forming a color filter layer and a microlens layer sequentially on the upper surface of the transparent material.

Preferably, between the step S101 and the step S102 also includes step S011: removing a passivation layer above a pixel array comprised of several photosensitive elements; wherein the passivation layer is a stacked structure comprising a lower SiN layer (the thickness is 1000 Å-2000 Å) and an upper $SiO_2$ layer; the step S011 includes removing the $SiO_2$ layer and stopping at the SiN layer, and then removing the SiN layer.

Preferably, the film-forming process in the step S103 includes PVD, CVD or ALD.

Preferably, since the portion of the deposited metal reflection layer required to be removed in the step S104 is formed on multiple surfaces with different heights including the bottom of the deep groove, the areas inside the deep groove except for the side wall, the top of the isolation regions between the deep grooves, and the areas outside the pixel array, different lithography and etching processes may be performed including single photolithography process and single etching process, single photolithography process using multiple masks at different focus planes with multiple exposures and single etching process, or multiple photolithography processes and multiple etching processes.

Preferably, the step S104 includes: firstly performing an exposure to the bottom area of the deep groove, so as to expose the corresponding portion of the metal reflection layer need to be etched; then performing an exposure to the metal reflection layer on the top of the isolation regions between the deep grooves, so as to expose the corresponding portion of the metal reflection layer need to be etched; subsequently performing an exposure to the metal reflection layer on the passivation layer formed outside the pixel array, so as to expose the corresponding portion of the metal reflection layer need to be etched; finally removing the portions of the metal reflection layer exposed in the areas mentioned above by etching.

Additionally, since the metal reflection layer at the side wall of the deep groove has a high longitudinal height, that is, the thickness of the metal reflection layer at the side wall of the deep groove is great, a large-area etching can be facilitated to remove the metal reflection layer above the surface plane of the silicon substrate while keeping the metal reflection layer at the side wall of the deep groove still remaining after the etching process.

A method of fabricating the pixel structure of the CMOS image sensor in the second embodiment of the present invention includes the following steps:

Step S201: arranging the photosensitive element and the multi-layer structure of the standard CMOS device on the silicon substrate, and forming the photosensitive element and the multi-layer structure by a standard CMOS process;

Step S202: forming vias in the top layer of the multi-layer structure and forming slots for accommodating the light reflection shielding layer;

Step S203: forming trenches for accommodating metal interconnects in a top first metal interconnect layer of the multi-layer structure;

Step S204: forming metal interconnects in the top first metal interconnect layer and a metal layer of the light reflection shielding layer;

Step S205: forming the deep groove by an etching process.

Preferably, the step S202 and the step S203 utilize a full Via First Dual Damascene process.

Preferably, the method further includes Step S206: filling the deep groove with a transparent material to form a transparent body, and forming a color filter layer and a microlens layer sequentially on the upper surface of the transparent body.

A method of fabricating the pixel structure of the CMOS image sensor in the third embodiment of the present invention includes the following steps:

Step S301: arranging the photosensitive element, the multi-layer structure of the standard CMOS device and the light reflection shielding layer on the silicon substrate, and forming the photosensitive element, the multi-layer structure and the light reflection shielding layer by a standard CMOS process; wherein the light reflection shielding layer comprises a second polycrystalline silicon layer, a second contact hole layer formed by multiple contacts closely arranged in a circle, a second metal interconnect layer formed by metal connects arranged in a circle, and a second via layer formed by multiple vias closely arranged in a circle;

Step S302: forming the deep groove by an etching process.

Preferably, the method further includes Step S303: filling the deep groove with a transparent material to form a transparent body, and forming a color filter layer and a microlens layer sequentially on the upper surface of the transparent body.

In the prior art, the dielectric layers above the photosensitive element are multi-layered, complex, and very thick, which means that the path length of the light to reach the photosensitive element is long, thus cause inevitable light loss during the light transmission as the light loss is proportional to the path length; additionally, in the light transmission, the light incident at some angle to the side wall of the deep groove will be refracted, transmitted and absorbed by the side wall, which also cause optical crosstalk between the adjacent pixels and light loss.

Therefore, in the pixel structure of the CMOS image sensor according to the present invention, the side wall of the deep groove above the photosensitive element is surrounded by metal interconnects, vias, contact holes and polysilicon in annular configurations, or directly surrounded by a metal layer. Since the material of the metal layer, the metal interconnects, the vias, the contacts and the polysilicon is metal or polycrystalline silicon, the light incident thereon is substantially completely reflected, thus the light with a larger incident angle incident on the side wall of the deep groove will not pass through the area between the adjacent pixels to a nearby pixel, which avoids the optical crosstalk and effectively improves the optical resolution and sensitivity of the pixel; in addition, since the incident light is reflected to the photosensitive element, the light absorption of the pixel is increased, which improves the optical sensitivity and resolution of the whole CMOS image sensor and the performance and reliability of the chip; furthermore, the passivation layer above the photosensitive element array can be removed by a large-area etching process, which decreases the length of the light transmission path and increases the incident angle of the light; moreover, since the distance from the photosensitive element to the color filter layer is reduced, light with a larger incident angle is enabled to reach the photosensitive element, which improves the light absorption of the photosensitive pixel.

BRIEF DESCRIPTION OF THE DRAWINGS

In order that objects, characteristics, and advantages of the present invention may be more fully understood, the embodiments of the present invention will now be described in detail hereafter with reference to the accompanying drawings, wherein.

DETAILED DESCRIPTION OF THE EMBODIMENTS

First Embodiment

Figure 1:
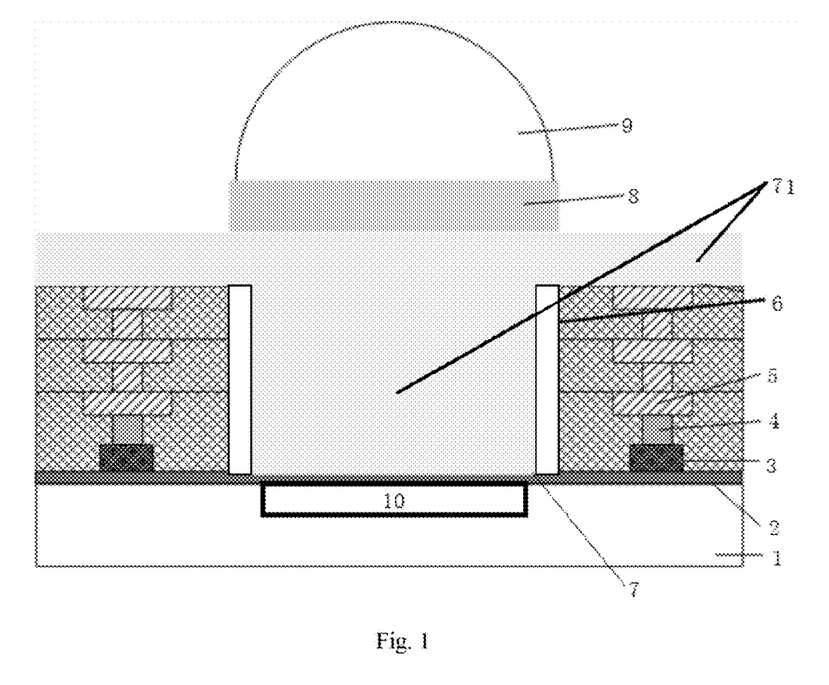
FIG. 1 is a cross sectional view of a pixel structure of the CMOS image sensor according to a first embodiment of the present invention.

Referring to FIG. 1, the pixel structure of the CMOS image sensor in the embodiment comprises a photosensitive diode 10 and a multi-layer structure of a standard CMOS device on a silicon substrate 1. In the embodiment, a gate oxide layer 2 is formed between the silicon substrate 1 and the multi-layer structure. Wherein, the multi-layer structure includes, from bottom to up, a polycrystalline silicon layer 3, a tungsten contact hole layer 4, a copper metal interconnect layer 5, and other via layers, metal interconnect layers and interconnecting dielectric layers on the copper metal interconnect layer 5. A deep groove 7 which has a light-transmitting space in it is formed above the photosensitive diode 10, the inner surface of the side wall of the deep groove 7 is surrounded by a metal reflection layer 6 to reflect the incident light on the metal reflection layer 6. The material of the metal reflection layer 6 is aluminum and the thickness of the metal reflection layer 6 is 100 Å; the metal reflection layer 6 is formed by a PVD film-forming method.

Wherein, a light-transmitting body 71 is formed in the deep groove by filling the deep groove 7 with a transparent material; the light-transmitting body 71 further covers the top layer of the multi-layer structure. A color filter layer 8 and a microlens layer 9 are arranged sequentially on the upper surface of the transparent material in the deep groove 7.

The method of fabricating a pixel array comprised of multiple pixel structures of the CMOS image sensor of the first embodiment includes:

Step S101: forming the photosensitive diode 10 and the multi-layer structure of the standard CMOS device on the silicon substrate by a standard CMOS process and removing a passivation layer above the pixel array; the passivation layer is a stacked structure comprising a lower SiN layer and an upper $SiO_2$ layer; the step of removing the passivation layer includes removing the $SiO_2$ layer and stopping at the SiN layer, and then removing the SiN layer;

Step S102: removing a dielectric layer on the photosensitive diode 10 by lithography and etching processes, so as to form the deep groove 7 having the light-transmitting space therein;

Step S103: depositing the metal reflection layer 6 on the silicon substrate surface by a PVD film-forming process;

Step S104: removing the metal reflection layer 6 in the deep groove 7 except for the portion at the side wall of the deep groove;

Step S105: filling the deep groove 7 with a transparent material and performing a planarization process;

Step S106: forming a color filter layer 8 and a microlens layer 9 sequentially on the upper surface of the transparent material in the deep groove 7.

Wherein, the step S104 includes: firstly performing an exposure to the bottom area of the deep groove 7 to expose the corresponding portion of the metal reflection layer need to be etched; then performing an exposure to the metal reflection layer on the top of the isolation region between the deep grooves 7 to expose the corresponding portion of the metal reflection layer need to be etched; subsequently performing an exposure to the metal reflection layer on the passivation layer outside the pixel array to expose the corresponding portion of the metal reflection layer need to be etched; finally removing the exposed portion of the metal reflection layer in the areas mentioned above by etching.

Second Embodiment

Figure 2:
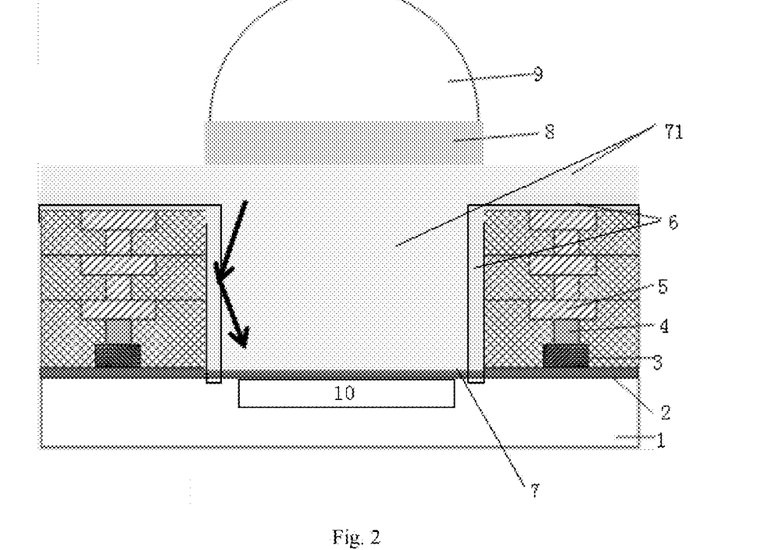
FIG. 2 is a cross sectional view of a pixel structure of the CMOS image sensor according to a second embodiment of the present invention.

Referring to FIG. 2, the pixel structure of the CMOS image sensor in the embodiment comprises a photosensitive diode 10 and a multi-layer structure (of a standard CMOS device) on a silicon substrate 1. In the embodiment, a gate oxide layer 2 is formed between the silicon substrate 1 and the multi-layer structure. Wherein, the multi-layer structure includes, from bottom to up, a polycrystalline silicon layer 3, a tungsten contact hole layer 4, a copper metal interconnect layer 5, and other via layers, metal interconnect layers and interconnecting dielectric layers on the copper metal interconnect layer 5. A deep groove 7 having a light-transmitting space therein is formed on the photosensitive diode 10, the side wall of the deep groove 7 is surrounded by a metal reflection layer 6 to reflect the incident light on the metal reflection layer 6. The metal reflection layer 6 is also formed on the top of the multi-layer structure to reflect the light incident from the top to the inner of the multi-layer structure, so as to further avoid the optical crosstalk between the adjacent pixels caused by the incident light. The material of the metal reflection layer 6 is Ti and the thickness of the metal reflection layer 6 is 500 Å; the metal reflection layer 6 is formed by a PVD film-forming method.

Wherein, a light-transmitting body 71 is formed in the deep groove by filling the deep groove 7 with transparent material, the light-transmitting body 71 further covers the top layer of the multi-layer structure. A color filter layer 8 and a microlens layer 9 are arranged sequentially on the upper surface of the transparent material in the deep groove 7.

Figure 3A:
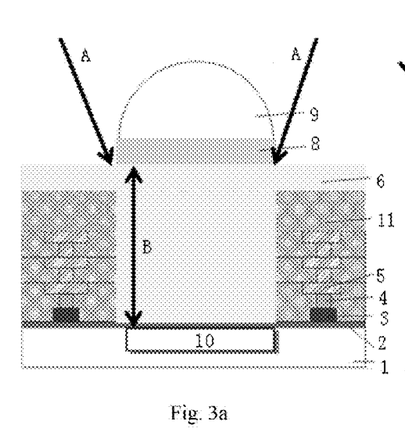
FIGS. 3a and 3b are views illustrating the pixel structure with or without a passivation layer.
Figure 3B:
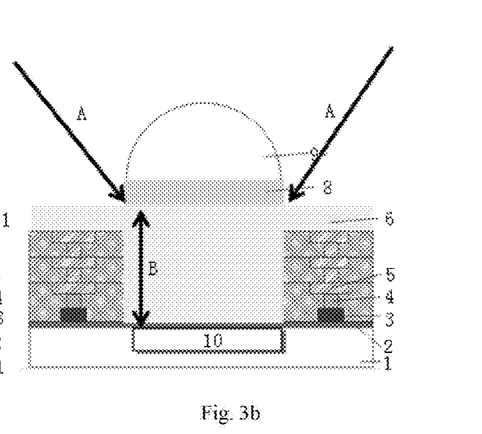

Referring to FIGS. 3a and 3b, compared with the multi-layer structure of FIG. 3b, the multi-layer structure shown in FIG. 3a further comprises a passivation layer 11. As shown in the drawings, when the passivation layer is removed, the incident angle of the light A to the pixel structure becomes larger and the light path B becomes shorter, whereby improving the light absorption of the pixel structure.

Figure 4:
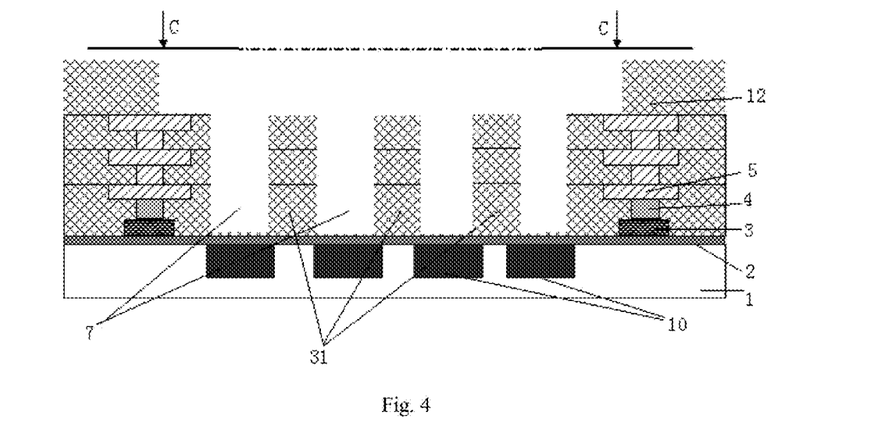
FIG. 4 is a cross sectional view of the structure of the photosensitive element array before forming a metal reflection layer according to an embodiment of the present invention.
Figure 5:
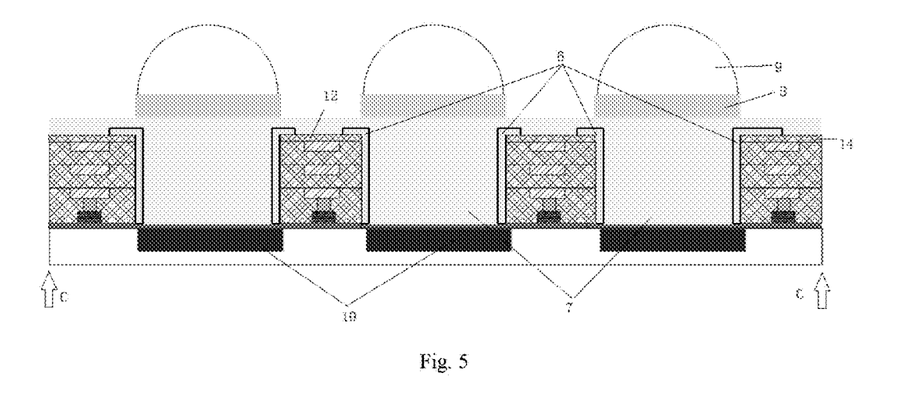
FIG. 5 is a cross sectional view of the structure of the photosensitive element array in FIG. 4 after forming the metal reflection layer and other layers according to an embodiment of the present invention.

Please refer to FIG. 4 and FIG. 5.

In FIG. 4, the passivation layer 12 above the photosensitive diode array C-C is firstly removed. Wherein, the passivation layer 12 is a stacked structure comprising a lower SiN layer and an upper $SiO_2$ layer formed sequentially. The step of removing the passivation layer 12 includes removing the $SiO_2$ layer and stopping at the SiN layer, and then removing SiN layer. Afterwards, the deep grooves 7 are formed on each photosensitive diode 10 (the layers of the multi-layer structure 31 between the adjacent pixel structures are omitted in FIG. 4).

In FIG. 5, the light-transmitting body, the metal reflection layer 6, the color filter layer 8 and the microlens layer 9 are formed above the photosensitive diode array C-C. As shown in FIG. 5, a dielectric layer 14 becomes the top layer of the multi-layer structure 31 to isolate and protect the metal interconnect layer in the multi-layer structure from the metal reflection layer 6. In addition, the portion of the metal reflection layer 6 on the top of the isolation regions between the deep grooves 7 is also removed, so as to avoid the crosstalk between the adjacent pixel structures.

Wherein, the transparent material in the first embodiment and the second embodiment is a conventional transparent resin including C, H and O.

Third Embodiment

Figure 6:
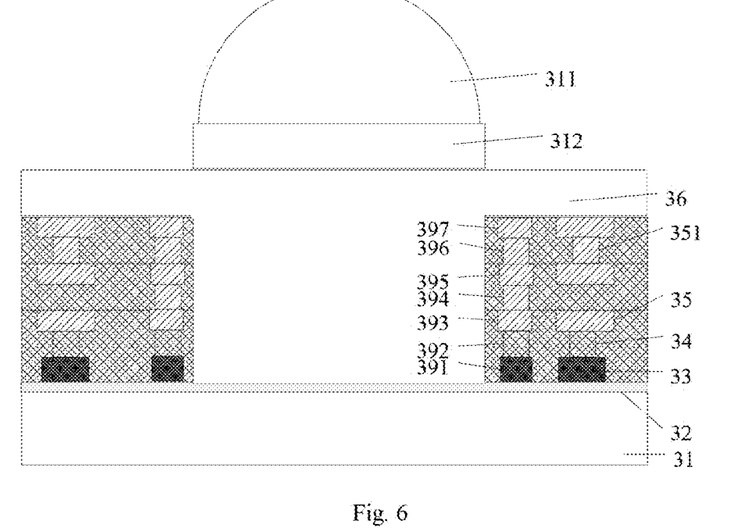
FIG. 6 is a cross sectional view of a pixel structure of the CMOS image sensor according to a third embodiment of the present invention

Referring to FIG. 6, the pixel structure of the CMOS image sensor comprises a photosensitive diode 37 and a multi-layer structure (of a standard CMOS device) on a silicon substrate 31. In the embodiment, a gate oxide layer 32 is formed between the silicon substrate 31 and the multi-layer structure. Wherein the multi-layer structure includes, from bottom to up, a polycrystalline silicon layer 33, a tungsten contact hole layer 34, a copper metal interconnect layer 35, a first via layer 351 and interconnecting dielectric layers (not shown). A deep groove 38 is formed on the photosensitive diode 37 and a light reflection shielding layer 39 is formed in the dielectric materials outside the side wall of the deep groove 38. The distance between the light reflection shielding layer 39 and the side wall of the deep groove 38 is 0.1 μm and the deep groove 38 is completely surrounded by the light reflection shielding layer 39. Furthermore, the light reflection shielding layer 39 comprises a second polycrystalline silicon layer 391, a second contact hole layer 392, a second metal interconnect layer A 393, a second via hole layer A 394, a second metal interconnect layer B 395, a second via hole layer B 396 and a second metal interconnect layer C 397, which are continuously stacked upward from the gate oxide layer 32. The deep groove 38 is filled with a transparent material to form a light-transmitting body 36.

Figure 7:
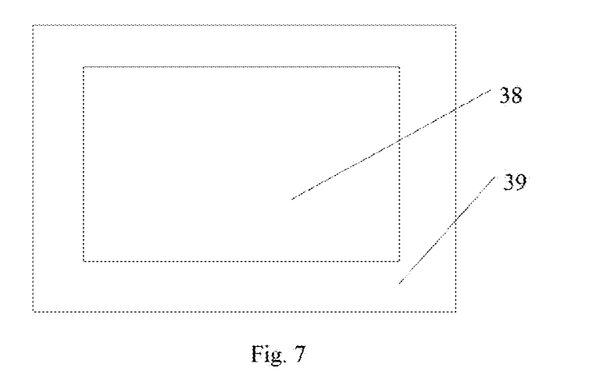
FIG. 7 is a top view of a second metal interconnect layer according to the third embodiment of the present invention.

Referring to FIG. 7, the second metal interconnect layer A 393, the second metal interconnect layer B 395 and the second metal interconnect layer C 397 are all in continuous circular configurations and completely surround the deep groove 38.

Figure 8:
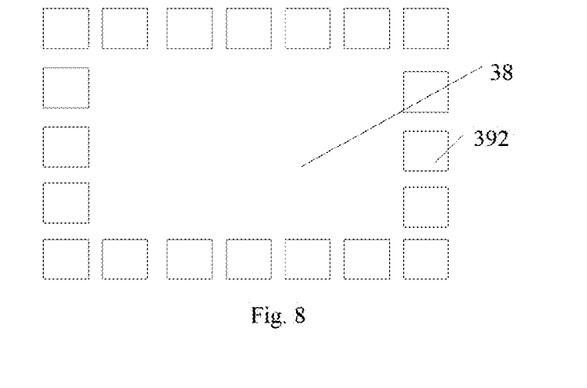
FIG. 8 is a top view of a second contact hole layer according to the third embodiment of the present invention.
Figure 9A:
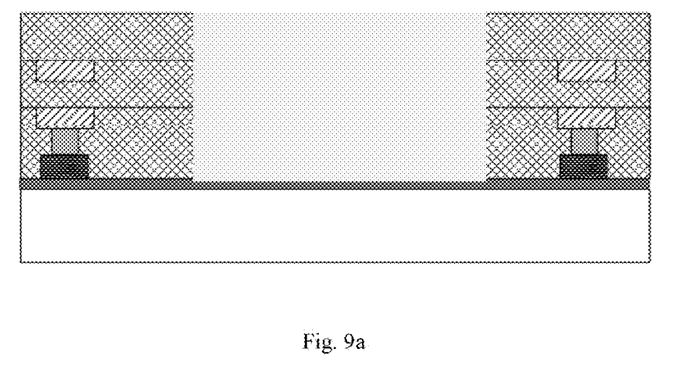
FIGS. 9a to 9d are views illustrating the method of fabricating a pixel structure of the CMOS image sensor according to a fourth embodiment of the present invention.
Figure 9B:
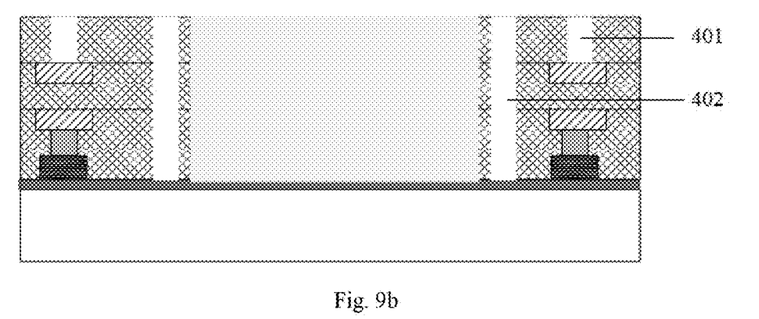
Figure 9C:
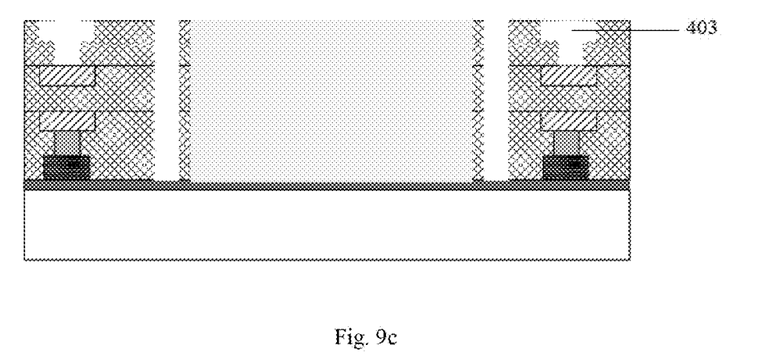
Figure 9D:
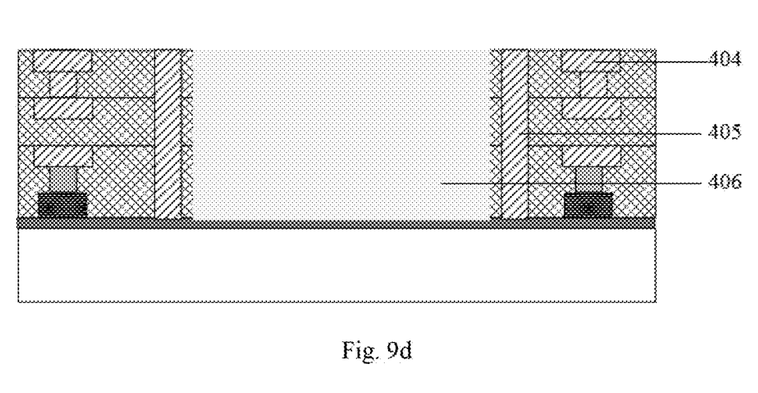

Referring to FIG. 8, the second contact hole layer 392 is formed by multiple contact holes closely arranged in a circle, and completely surrounds the deep groove 38. Each of the second via layer A 394 and the second via layer B 396 is formed by multiple vias closely arranged in a circle and completely surrounds the deep groove 38.

In the embodiment, the second polycrystalline silicon layer 391 is formed by a gate process of the standard CMOS process. The material of the second polycrystalline silicon layer 391 is N-type doped polysilicon, the second polycrystalline silicon layer is formed together with the gate of an N-type MOS. The second contact hole layer 392 is formed by a contact hole process of the standard CMOS process. The material of the second contact hole layer 392 is tungsten. The three second metal interconnect layers are all formed by the contact hole process of the standard CMOS process. The material of the metal interconnects in the second metal interconnect layers is copper, the metal interconnects are formed by the Cu Damascene process. Both of the second via layers are formed by the contact hole process of the standard CMOS process. The material filled in the vias is copper, and the second via layers are formed by the Cu Damascene process.

In the embodiment, a color filter layer 312 and a microlens layer 311 are sequentially formed from bottom to up on the upper surface of the planarized transparent body 36 and above the deep groove 38.

The method of fabricating the pixel structure of the CMOS image sensor in the embodiment includes:

Step S201: arranging the photosensitive diode 37, the multi-layer structure and the light reflection shielding layer 39 on the silicon substrate 31, and forming the photosensitive diode 37, the multi-layer structure and the light reflection shielding layer 39 by a standard CMOS process;

Step S202: removing all the dielectric materials on the photosensitive diode 37 by etching to form the deep groove 38;

Step S203: filling the deep groove 38 with the transparent body 36 and performing a planarization process to the surface of the transparent body 36;

Step S204: forming the color filter layer 312 and the microlens layer 311 sequentially on the upper surface of the transparent body 36 after the planarization process.

Fourth Embodiment

In the embodiment, the light reflection shielding layer is an integrated circular metal layer continuously formed upwardly from the gate oxide layer in the longitudinal direction.

Referring to FIGS. 9a to 9d, the method of fabricating the pixel structure of the CMOS image sensor of the embodiment includes:

Step S301: arranging the photosensitive diode and the multi-layer structure of a standard CMOS device on the silicon substrate, and forming the photosensitive diode and the multi-layer structure by a standard CMOS process;

Step S302: forming vias 401 in the top layer of the multi-layer structure and forming slots 402 for accommodating the light reflection shielding layer by lithography and etching;

Step S303: forming trenches 403 for accommodating metal interconnects in a top first metal interconnect layer of the multi-layer structure by lithography and etching;

Step S304: forming the metal interconnects 404 in the top first metal interconnect layer and metal layer 405 of the light reflection shielding layer by a standard process;

Step S305: forming the deep groove by an etching process, and then filling the deep groove 406 with a transparent body and performing a planarization process to the surface of the transparent body;

Step S306: forming a color filter layer and a microlens layer sequentially on the upper surface of the transparent body after the planarization process.

While this invention has been particularly shown and described with references to preferred embodiments thereof, if will be understood by those skilled in the art that various changes in form and details may be made herein without departing from the spirit and scope of the invention as defined by the appended claims.

The invention claimed is:

1. A pixel structure of a CMOS image sensor comprising: a photosensitive element and a multi-layer structure of a standard CMOS device formed on a silicon substrate; wherein a deep groove having a light-transmitting space therein is formed above the photosensitive element, the horizontal projection area of the deep groove completely covers the photosensitive element; wherein the side wall of the deep groove is surrounded by a light reflection shielding layer which is continuously arranged in a longitudinal direction to reflect the light incident on the light reflection shielding layer; wherein, the light reflection shielding layer is a metal reflection layer which is deposited after the formation of the deep groove to be arranged inward and attached to the side wall of the deep groove, or the light reflection shielding layer is a metal reflection layer which is formed together with a top first metal interconnect layer of the multi-layer structure before the formation of the deep groove and is arranged outward surrounding the side wall of the deep groove with a dielectric layer formed between the metal reflection layer and the deep groove, or the light reflection shielding layer is formed together with the multi-layer structure before the formation of the deep groove, including a second polycrystalline silicon layer formed by polysilicon in a circle, a second contact hole layer formed by multiple contact holes closely arranged in a circle, a second metal interconnect layer formed by metal connects arranged in a circle and a second via layer formed by multiple vias closely arranged in a circle which are stacked continuously from bottom to top and is arranged outward surrounding the side wall of the deep groove with a dielectric layer formed between the light reflection shielding layer and the deep groove.

2. The pixel structure of the CMOS image sensor according to claim 1, wherein the metal reflection layer extends from the bottom of the deep groove up to the top of the deep groove, and further extends to cover the multi-layer structure; the top layer of the multi-layer structure is a dielectric layer.

3. The pixel structure of the CMOS image sensor according to claim 1, wherein the material of the metal reflection layer includes Al, Cu, Pt, Ru, TaN, Ta, Ti, TiN and composite stacked materials thereof; and the metal reflection layer has a thickness of 50 Å-5000 Å.

4. The pixel structure of the CMOS image sensor according to claim 1, wherein the material of the second polycrystalline silicon layer is N-type doped polysilicon, P-type doped polysilicon, or un-doped polysilicon; the material of contact holes and vias respectively in the second contact hole layer and the second via layer is copper or tungsten; the material of metal connects in the second metal interconnect layer is copper or aluminum.

5. The pixel structure of the CMOS image sensor according to claim 1, wherein the thickness of the dielectric layer between the light reflection shielding layer and the side wall of the deep groove is 0.05 µm-1 µm.

6. The pixel structure of the CMOS image sensor according to claim 1, wherein the horizontal projection of the light reflection shielding layer has a polygonal shape and surrounds the photosensitive element.

7. The pixel structure of the CMOS image sensor according to claim 6, wherein the polygonal shape is square or hexagon.

8. The pixel structure of the CMOS image sensor according to claim 1, wherein the deep groove is filled with a transparent material to form a light-transmitting body.

9. The pixel structure of the CMOS image sensor according to claim 8, wherein the light-transmitting body formed by the transparent material further covers the metal reflection layer on the top of the multi-layer structure; a color filter layer and a microlens layer are sequentially arranged on the upper surface of the light-transmitting body.

10. The pixel structure of the CMOS image sensor according to claim 9, wherein the transparent material is a transparent resin including C, H and O.

11. The pixel structure of the CMOS image sensor according to claim 10, wherein the photosensitive element is a photosensitive diode; the multi-layer structure comprises a first polycrystalline silicon layer, a first metal interconnect layer, a first contact hole layer, a first via layer and a first interconnect dielectric layer.

* * * * *